US008570198B2

(12) United States Patent
Chang

(10) Patent No.: US 8,570,198 B2
(45) Date of Patent: Oct. 29, 2013

(54) SERIALIZER AND DATA SERIALIZING METHOD

(75) Inventor: Hui-Ju Chang, Kaohsiung (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 0 days.

(21) Appl. No.: 13/535,276

(22) Filed: Jun. 27, 2012

(65) Prior Publication Data

US 2013/0187799 A1    Jul. 25, 2013

(30) Foreign Application Priority Data

Jan. 20, 2012  (TW) .............................. 101102438 A

(51) Int. Cl.
*H03M 9/00*           (2006.01)
(52) U.S. Cl.
USPC .......................................... 341/101; 341/100
(58) Field of Classification Search
USPC .................. 341/100, 101, 134, 135
See application file for complete search history.

(56) References Cited

U.S. PATENT DOCUMENTS

| 6,107,946 A * | 8/2000 | Jeong ............................ 341/101 |
| 7,006,021 B1 * | 2/2006 | Lombaard ..................... 341/100 |
| 7,106,227 B2 * | 9/2006 | Karlquist ...................... 341/101 |
| 7,551,107 B2 * | 6/2009 | Shim et al. .................... 341/101 |
| 7,864,084 B2 * | 1/2011 | Padaparambil ............... 341/101 |
| 2002/0075173 A1 * | 6/2002 | Nagata .......................... 341/101 |
| 2009/0273494 A1 * | 11/2009 | Jeffries et al. ................. 341/101 |

* cited by examiner

*Primary Examiner* — Peguy Jean Pierre
(74) *Attorney, Agent, or Firm* — McClure, Qualey & Rodack, LLP

(57) ABSTRACT

The invention provides a serializer. In one embodiment, the serializer converts parallel input data into serial output data according to a full swing clock and a noiseless differential clock, and comprises a plurality of parallel-input-serial-output (PISO) shift registers, a plurality of current-mode-logic (CML) D flip-flops, and at least one multiplexer. The PISO shift registers respectively selects a plurality of received input bits from the input bits of the parallel input data, and respectively serializes the received input bits according to the full swing clock to generate a plurality of first middle data signals. The CML D flip-flops respectively latches the first middle data signals to generate a plurality of second middle data signals. The at least one multiplexer receives the second middle data signals, and interleaves the second middle data signals according to the noiseless differential clock to generate the serial output data.

12 Claims, 9 Drawing Sheets

SERIALIZER AND DATA SERIALIZING METHOD

CROSS REFERENCE TO RELATED APPLICATIONS

This application claims priority of Taiwan Patent Application No. 101102438, filed on Jan. 20, 2012, the entirety of which is incorporated by reference herein.

BACKGROUND OF THE INVENTION

1. Field of the Invention

The invention relates to data processing, and more particularly to data serialization.

2. Description of the Related Art

A serializer converts parallel input data to serial output data. The serializer is therefore widely used in data processing. When the serializer is used in application with high speed data transmission, the circuit components of the serializer must be made of current mode logics (CML). A current mode logic, however, has greater power consumption than that of a standard cell and the serializer made of current mode logics therefore has high power consumption. In addition, the current mode logic occupies a larger chip area than a standard cell, and the manufacturing costs of the serializer made of current mode logics is therefore high. To lower manufacturing costs and to increase the data transmission speed, a conventional serializer comprises both current mode logics and standard cells.

The operation of a serializer must be triggered by a clock signal. Ordinarily, when a serializer comprises both current mode logics and standard cells, the standard cells with a low data transmission speed are triggered by a full swing clock, and the current mode logics with a high data transmission speed are triggered by a differential clock. Ordinarily, a differential clock is generated by a phase-locked-loop (PLL) voltage controlled oscillator (VCO), and a differential-to-single circuit then converts the differential clock to a full swing clock. When the differential-to-single circuit converts the differential clock to the full swing clock, noises and corner variation are induced to the full swing clock. When the current mode logics and standard cells of the serializer are operated according to the differential clock and the full swing clock, the current mode logics cannot synchronously operate with the standard cells due to the corner variation between the differential clock and the full swing clock. Data errors are therefore induced, and the output data of the serializer comprises jitter induced by the noise of the full swing clock. Thus, a serializer operating with a differential clock and a full swing clock is therefore required to prevent output data from errors.

BRIEF SUMMARY OF THE INVENTION

The invention provides a serializer. In one embodiment, the serializer converts parallel input data into serial output data according to a full swing clock and a noiseless differential clock, and comprises a plurality of parallel-input-serial-output (PISO) shift registers, a plurality of current-mode-logic (CML) D flip-flops, and at least one multiplexer. The PISO shift registers respectively selects a plurality of received input bits from the input bits of the parallel input data, and respectively serializes the received input bits according to the full swing clock to generate a plurality of first middle data signals. The CML D flip-flops respectively latches the first middle data signals to generate a plurality of second middle data signals. The at least one multiplexer receives the second middle data signals, and interleaves the second middle data signals according to the noiseless differential clock to generate the serial output data.

The invention also provides a data serializing method for converting parallel input data into serial output data. In one embodiment, a serializer comprises a plurality of parallel-input-serial-output (PISO) shift registers, a plurality of current-mode-logic (CML) D flip-flops, and at least one multiplexer. First, a plurality of received input bits are respectively selected from the input bits of the parallel input data by the PISO shift registers. The received input bits are then respectively serialized according to the full swing clock to generate a plurality of first middle data signals by the PISO shift registers. The first middle data signals are then respectively latched by the CML D flip-flops to generate a plurality of second middle data signals. The second middle data signals are then interleaved according to the noiseless differential clock by the at least one multiplexer to generate the serial output data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
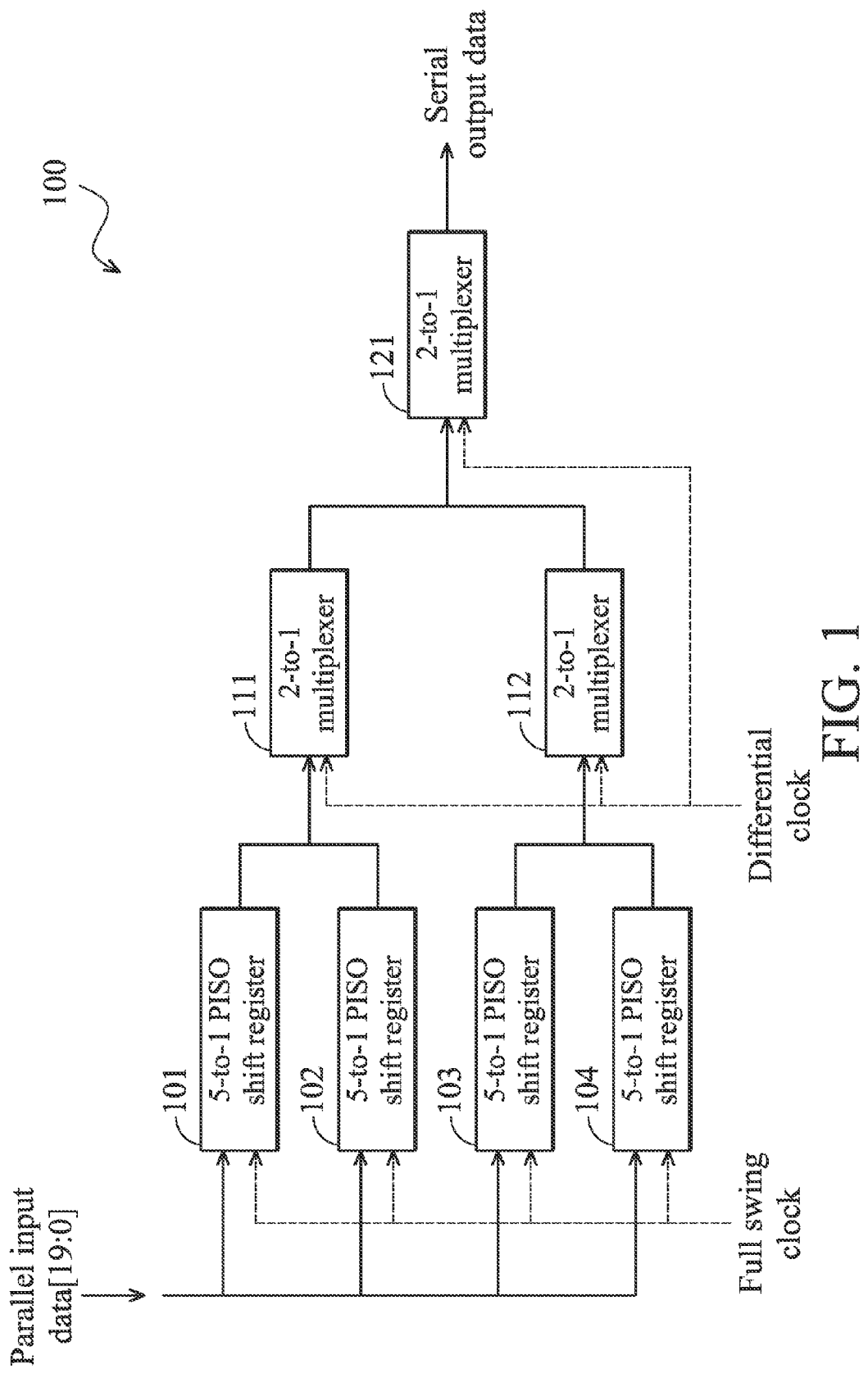
FIG. 1 is a block diagram of an ordinary serializer.

Referring to FIG. 1, a block diagram of an ordinary serializer 100 is shown. The serializer 100 receives parallel input data comprising 20 bits, and converts the parallel input data to serial output data. The serialzer 100 operates according to a differential clock and a full swing clock. In one embodiment, the serialzer 100 comprises a plurality of parallel-input-serial-output (PISO) shift registers 101~104 and a plurality of multiplexers 111, 112, 121. In one embodiment, the PISO shift registers 101, 102, 103, and 104 are 5-to-1 PISO shift registers. The PISO shift registers 101~104 respectively receive 5 bits from the 20 bits of the parallel input data, and then respectively serialize the 5 received bits according to a full swing clock to obtain first serial data signals. In one embodiment, the multiplexers 111, 112, and 121 are 2-to-1 multiplexers. The multiplexer 111 receives the first serial data signals output from the PISO shift registers 101 and 102 and then interleaves data bits of the first serial data signals according to a differential clock to obtain a second serial data signal. The multiplexer 112 receives the first serial data signals output from the PISO shift registers 103 and 104 and then interleaves data bits of the first serial data signals according to the differential clock to obtain a second serial data signal. The multiplexer 121 then receives the second serial data signals output from the multiplexers 111 and 112 and then interleaves data bits of the second serial data signals according to the differential clock to obtain the serial output data.

Figure 2A:
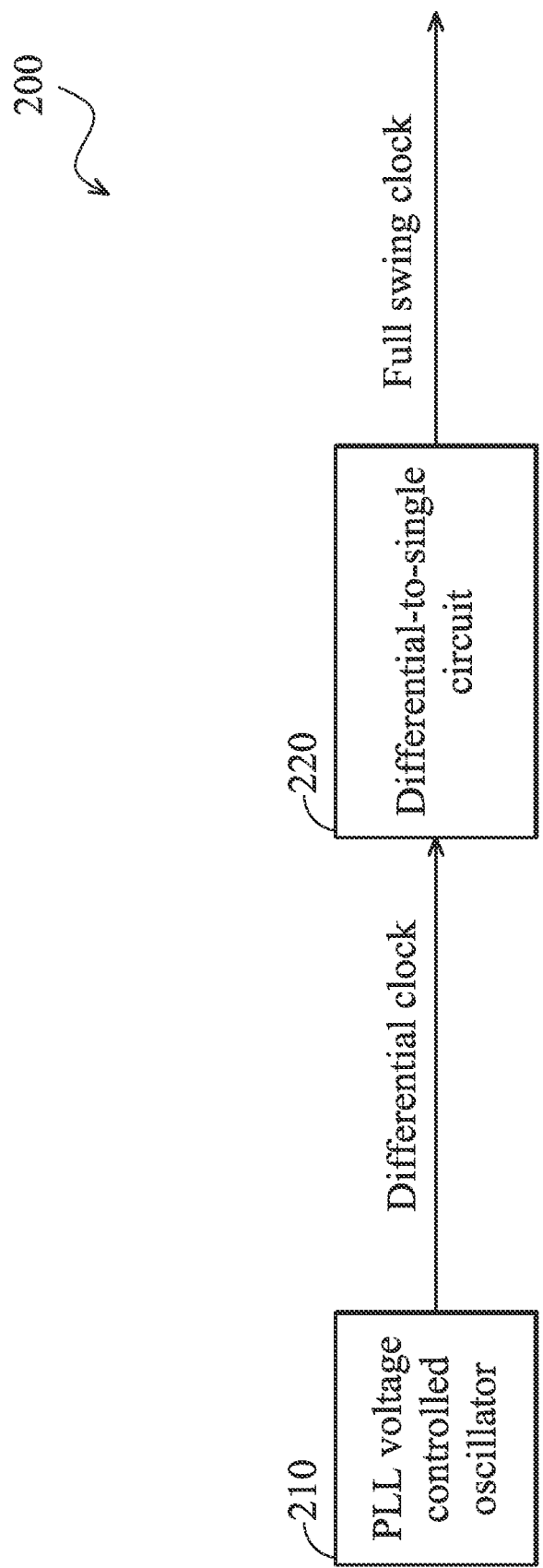
FIG. 2A is a block diagram of a clock generation circuit.
Figure 2B:
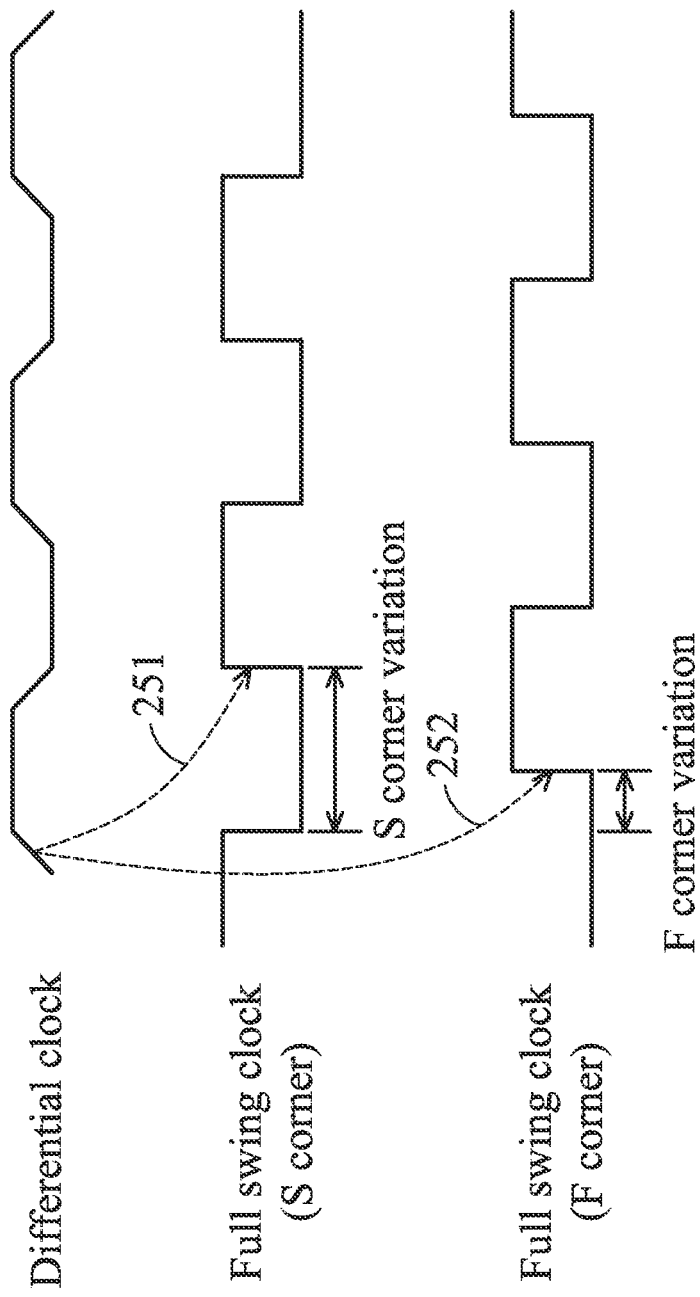
FIG. 2B is a schematic diagram of a differential clock and a full swing clock generated by the clock generation circuit shown in FIG. 2A.

Referring to FIG. 2A, a block diagram of a clock generation circuit 200 is shown. The clock generation circuit 200 generates a differential clock and a full swing clock to trigger a serializer. In one embodiment, the clock generation circuit 200 comprises a phased-lock-loop (PLL) voltage controlled oscillator (VCO) 210 and a differential-to-single circuit 220. The PLL voltage controlled oscillator 210 generates a differential clock, and the differential-to-single circuit 220 derives a full swing clock from the differential clock. Referring to FIG. 2B, a schematic diagram of the differential clock and the full swing clock generated by the clock generation circuit shown in FIG. 2A is shown. When the differential-to-single circuit 220 generates the full swing clock according to the differential clock, two types of corner variations are induced to the full swing clock. When the differential-to-single circuit 220 induces an S corner variation 251, the full swing clock is delayed by a long period. When the differential-to-single circuit 220 induces an F corner variation 252, the full swing clock is delayed by a short period. Both the S corner variation and the F corner variation induce a phase difference between the full swing clock and the differential clock. The PISO shift registers of a serilaizer therefore cannot operate synchronously with the multiplexers of the serializer, and data errors are therefore induced to the serial output data output by the serializer.

Figure 3A:
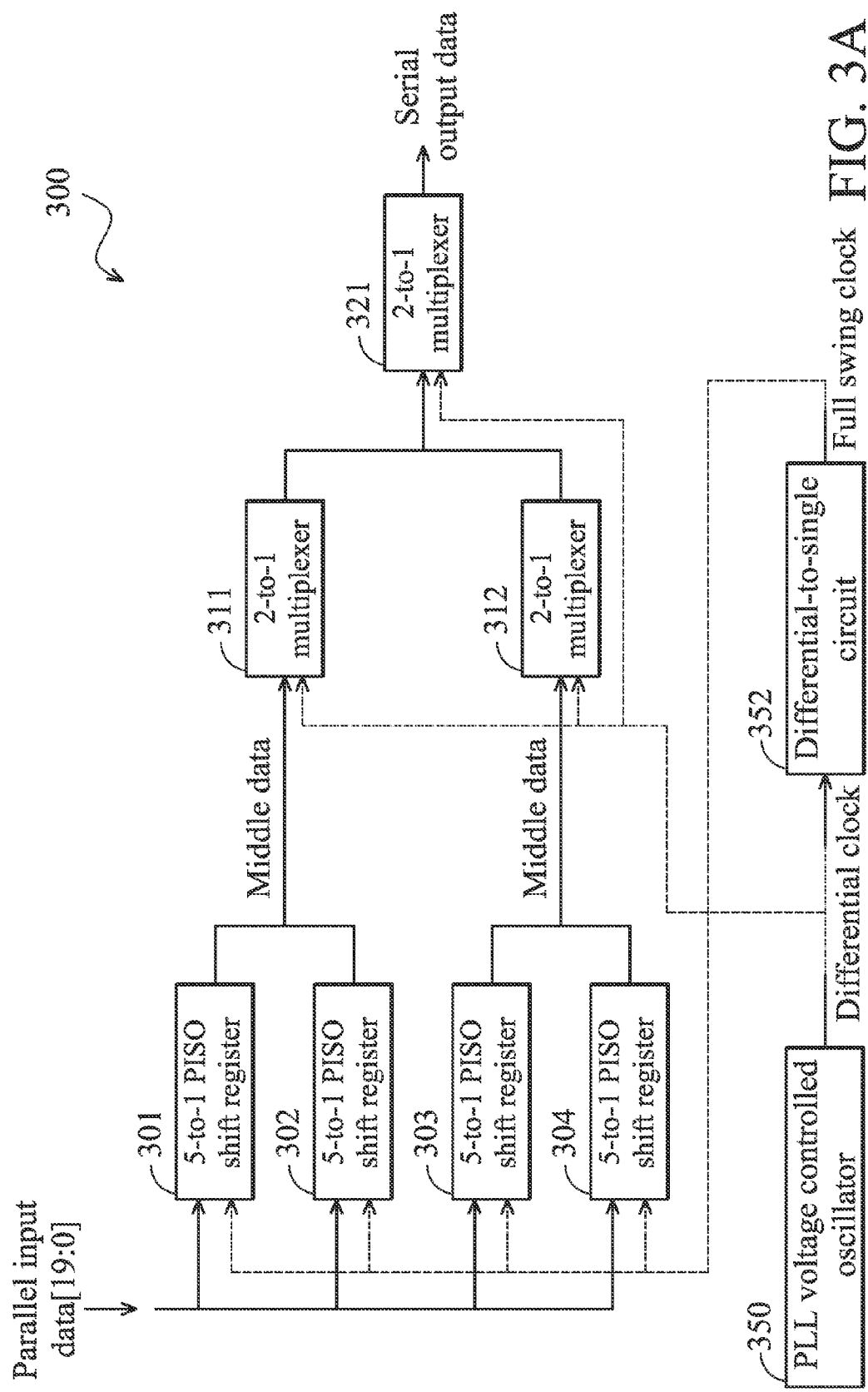
FIG. 3A is a block diagram of a serializer comprising the clock generation circuit shown in FIG. 2A.

Referring to FIG. 3A, a block diagram of a serializer 300 comprising the clock generation circuit shown in FIG. 2A is shown. In one embodiment, the serializer 300 comprises a plurality of PISO shift registers 301~304, a plurality of multiplexers 311, 312, and 321, a PLL voltage controlled oscillator 350, and a differential-to-single circuit 352. The PISO shift registers 301~304 have the same functions as those of the PISO shift registers 101~104 shown in FIG. 1. The multiplexers 311, 312, and 321 also have the same functions as those of the multiplexers 111, 112, and 121 shown in FIG. 1. The PLL voltage controlled oscillator 350 generates a noiseless differential clock to trigger the operations of the multiplexers 311, 312, and 321. The differential-to-single circuit 352 generates a full swing clock according to the differential clock, and the full swing clock triggers the operations of the PISO shift registers 301~304. Because there is an S corner variation or F corner variation between the full swing clock and the differential clock, there is a phase difference between the full swing clock and the differential clock. The phase difference makes the operation of the PISO shift registers 301~304 unsynchronous with the operations of the multiplexers 311, 312, and 321, and errors are therefore induced to the serial output data.

Figure 3B:
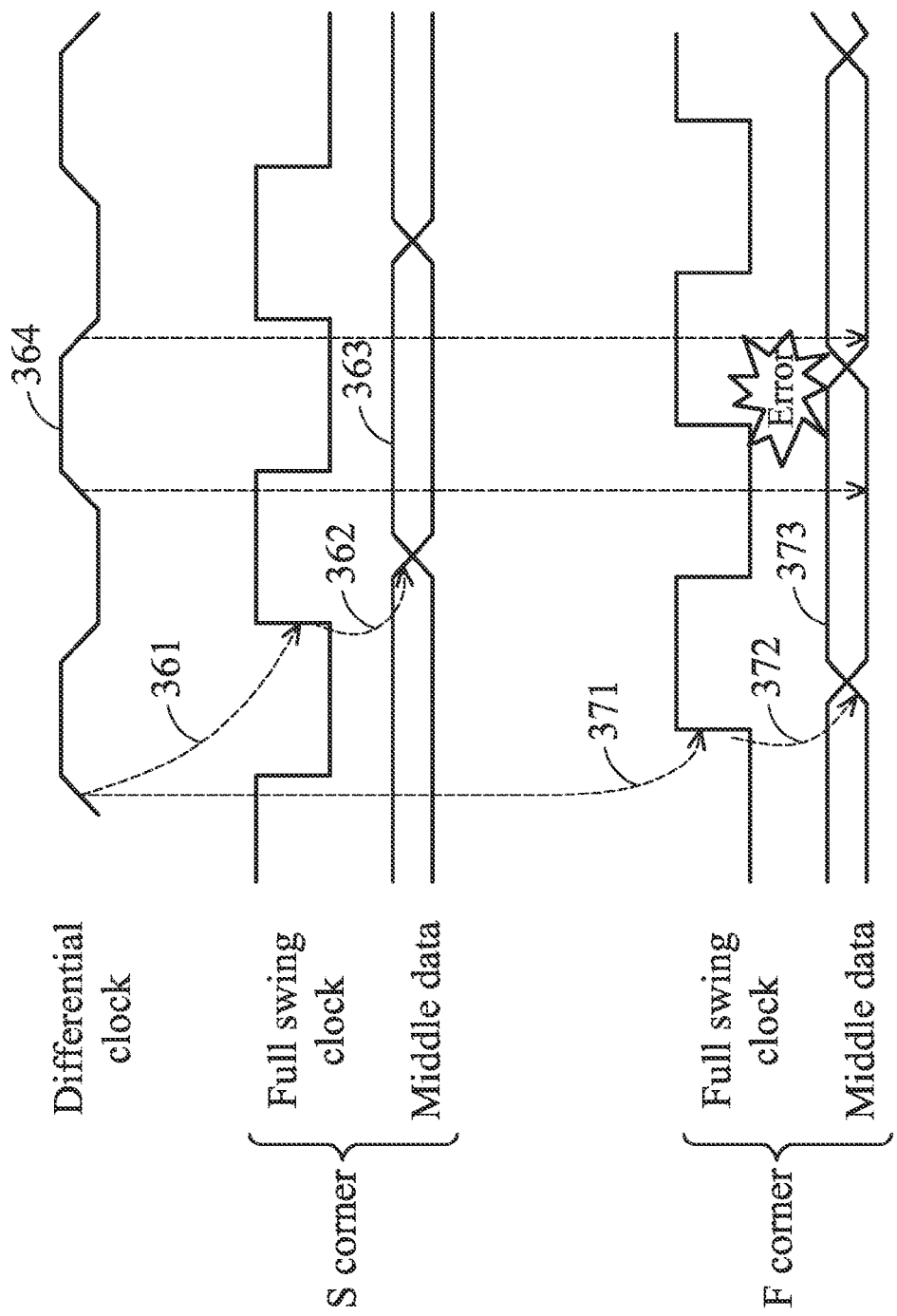
FIG. 3B is a schematic diagram of data errors generated by the serializer shown in FIG. 3A.

Referring to FIG. 3B, a schematic diagram of data errors generated by the serializer 300 shown in FIG. 3A is shown. The PLL voltage controlled oscillator 350 generates a noiseless differential clock. The differential-to-single circuit 352 then derives a full swing clock from the differential clock, and there is an F corner variation 371 or S corner variation 361 between the full swing clock and the differential clock. When there is an S corner variation 361 between the full swing clock and the differential clock, the PISO shift registers 301~304 generate middle data signals 363 according to the full swing clock, and there is a short delay 362 between the middle data signals 363 and the full swing clock. When the multiplexers 311 and 312 sample the middle data signals according to the differential clock 364, because the period 364 in which the differential clock has a true value corresponds to the data period 363 of the middle data signal, data errors are not induced.

If there is an F corner variation 371 between the full swing clock and the differential clock, the PISO shift registers 301~304 generate middle data signals 373 according to the full swing clock, and there is a short delay 372 between the middle data signals 373 and the full swing clock. When the multiplexers 311 and 312 sample the middle data signals according to the differential clock 364, because the period 364 in which the differential clock has a true value does not correspond to the data period 373 of the middle data signal, data errors are therefore induced to the serial output data of the serializer. Because the S corner variation and the F corner variation randomly happen, errors are therefore randomly induced to the serial output data generated by the serializer 300.

Figure 4A:
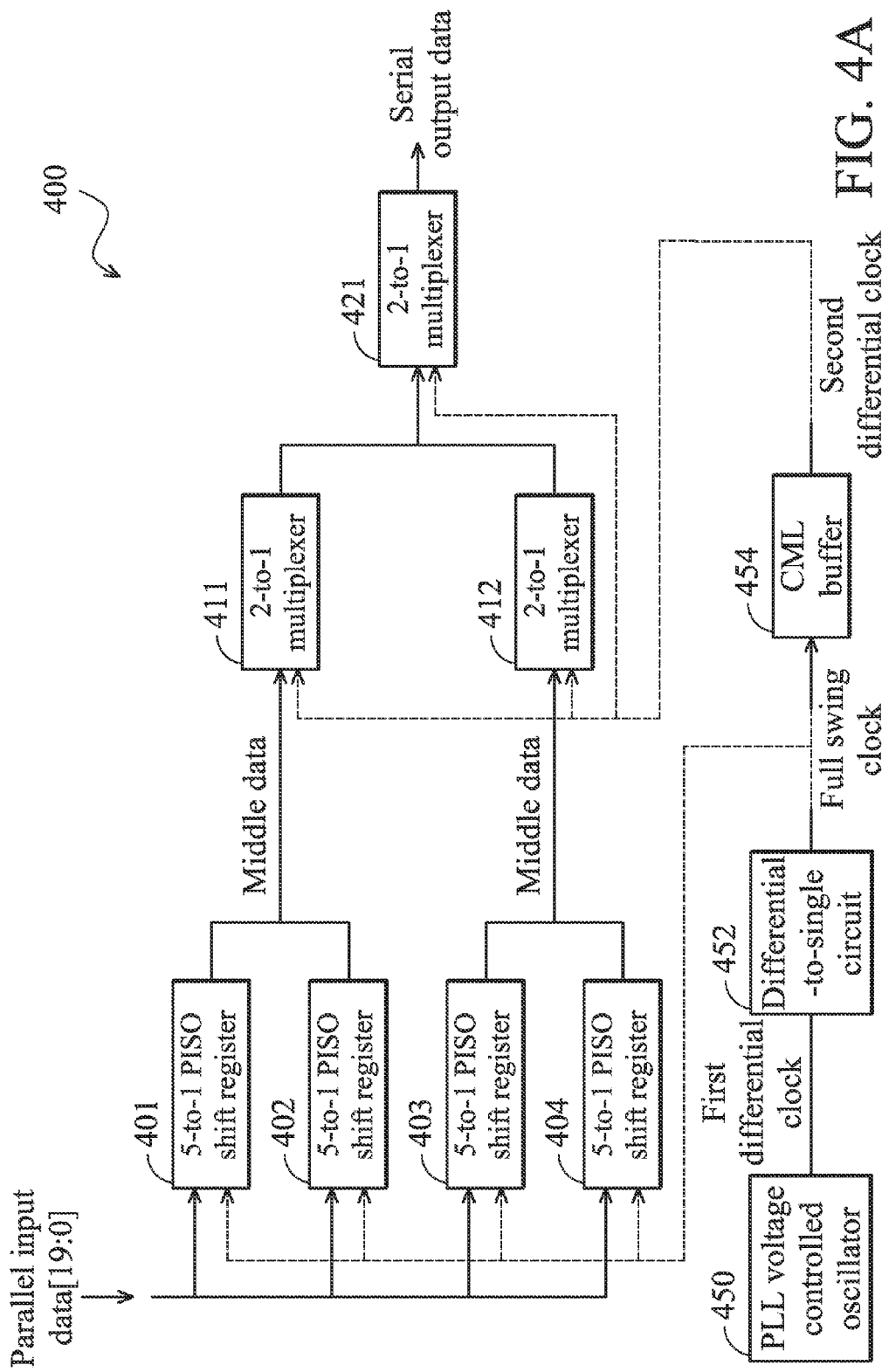
FIG. 4A is a block diagram of a serializer avoiding the occurrence of a phase difference between a full swing clock and a differential clock.

To avoid data errors shown in FIG. 3B from occurring, the corner variations between the full swing clock and the differential clock must be prevented. Referring to FIG. 4A, a block diagram of a serializer 400 avoiding the occurrence of a phase difference between a full swing clock and a differential clock is shown. In one embodiment, the serializer 400 comprises a plurality of PISO shift registers 401~404, a plurality of multiplexers 411, 412, and 421, a PLL voltage controlled oscillator 450, a differential-to-single circuit 452, and a current mode logic (CML) buffer 454. The PISO shift registers 401~404 have the same functions as those of the PISO shift registers 101~104 shown in FIG. 1. The multiplexers 411, 412, and 421 also have the same functions as those of the multiplexers 111, 112, and 121 shown in FIG. 1. The PLL voltage controlled oscillator 450 generates a noiseless first differential clock. The differential-to-single circuit 452 then generates a full swing clock according to the differential clock, and the full swing clock triggers the operations of the PISO shift registers 401~404. The CML buffer 454 then generates a second differential clock according to the full swing clock, and the second differential clock then triggers the operations of the multiplexers 411, 412, and 421. When the differential-to-single circuit 452 generates the full swing clock according to the first differential clock, there is an S corner variation or F corner variation between the full swing clock and the first differential clock. When the CML buffer 454 generates the second differential clock according to the full swing clock, the second differential clock comprises the S corner variation or the F corner variation of the full swing clock. Thus, there is no phase difference between the full swing clock and the second differential clock, the PISO shift registers 401~404 can therefore operate synchronously with the multiplexers 411, 412, and 421, and errors are avoided and are not induced to the serial output data generated by the serializer 400.

Figure 4B:
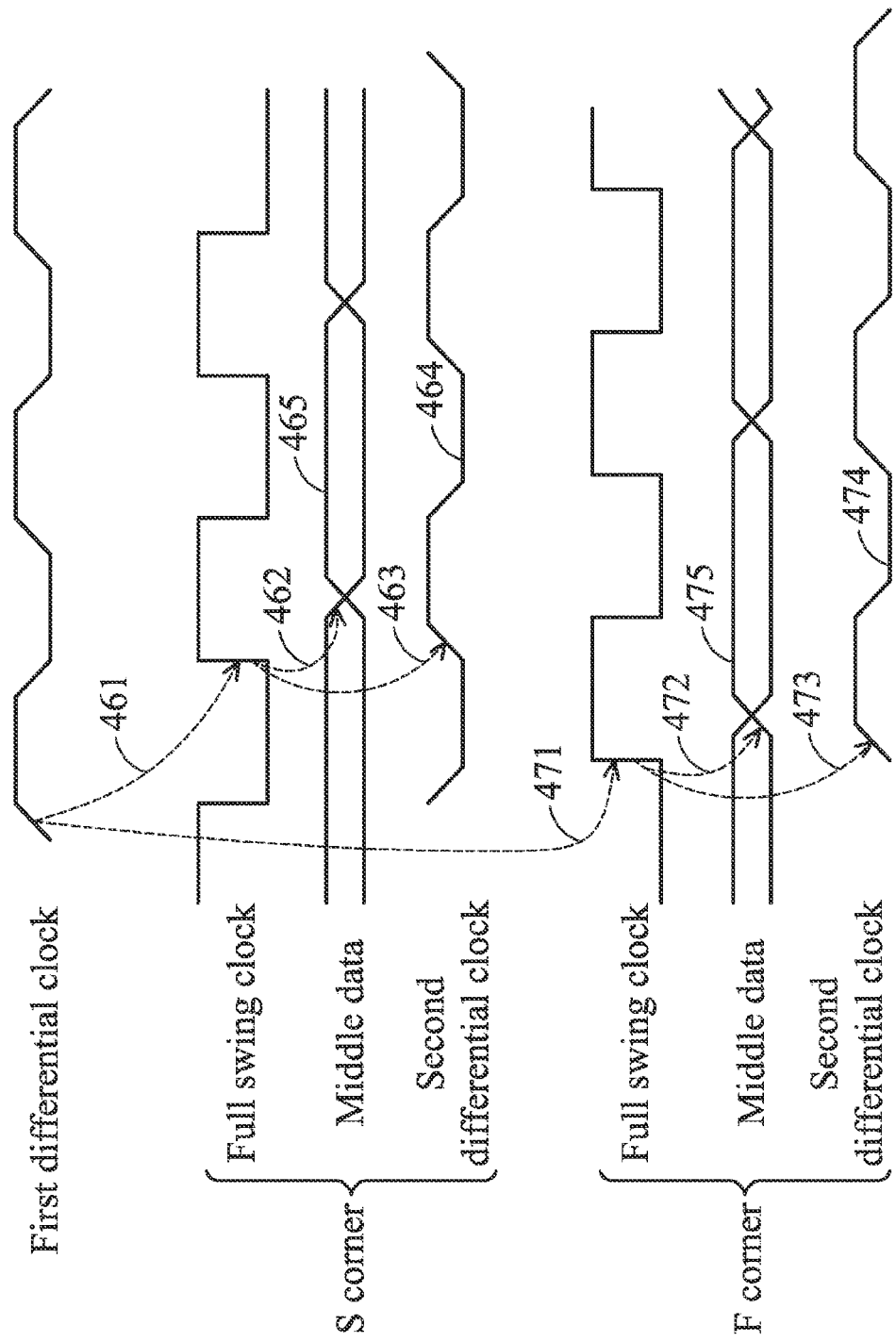
FIG. 4B is a schematic diagram of a data sampling process of the serializer shown in FIG. 4A.

Referring to FIG. 4B, a schematic diagram of a data sampling process of the serializer 400 shown in FIG. 4A is shown. The PLL voltage controlled oscillator 450 generates a noiseless first differential clock. The differential-to-single circuit 452 then derives a full swing clock from the first differential clock, and there is an F corner variation 471 or S corner variation 461 between the full swing clock and the first differential clock. When there is an S corner variation 461 between the full swing clock and the first differential clock, the PISO shift registers 401~404 generate middle data signals 465 according to the full swing clock, and there is a short delay 462 between the middle data signals 465 and the full swing clock. In addition, the CML buffer 454 generates a second differential signal 464 according to the full swing clock. Because there is no apparent corner variation in the CML buffer 454, there is no apparent phase difference 463 between the full swing clock and the second differential clock. When the multiplexers 411 and 412 sample the middle data signals 465 according to the second differential clock 464, because the period 464 in which the second differential clock has a false value corresponds to the data period 465 of the middle data signal, data errors are not induced.

Similarly, when there is an F corner variation 471 between the full swing clock and the first differential clock, the PISO shift registers 401~404 generate middle data signals 475 according to the full swing clock, and there is a short delay 472 between the middle data signals 475 and the full swing clock. In addition, the CML buffer 454 generates a second differential signal 474 according to the full swing clock, and there is no apparent phase difference 473 between the full swing clock and the second differential clock. When the multiplexers 411 and 412 sample the middle data signals 475 according to the second differential clock 474, because the period 474 in which the second differential clock has a false value corresponds to the data period 475 of the middle data signal, data errors are not induced.

Although the serializer 400 prevents the serial output data from being induced by errors, the serial output data generated by the serializer 400 comprises great jitter. Because the jitter comprised by the full swing clock is passed to the second differential clock, when the multiplexers 411, 412, and 421 operates according to the second differential clock, the multiplexers 411, 412, and 421 generates serial output data with jitter, and the performance of the serializer 400 is degraded.

Figure 5:
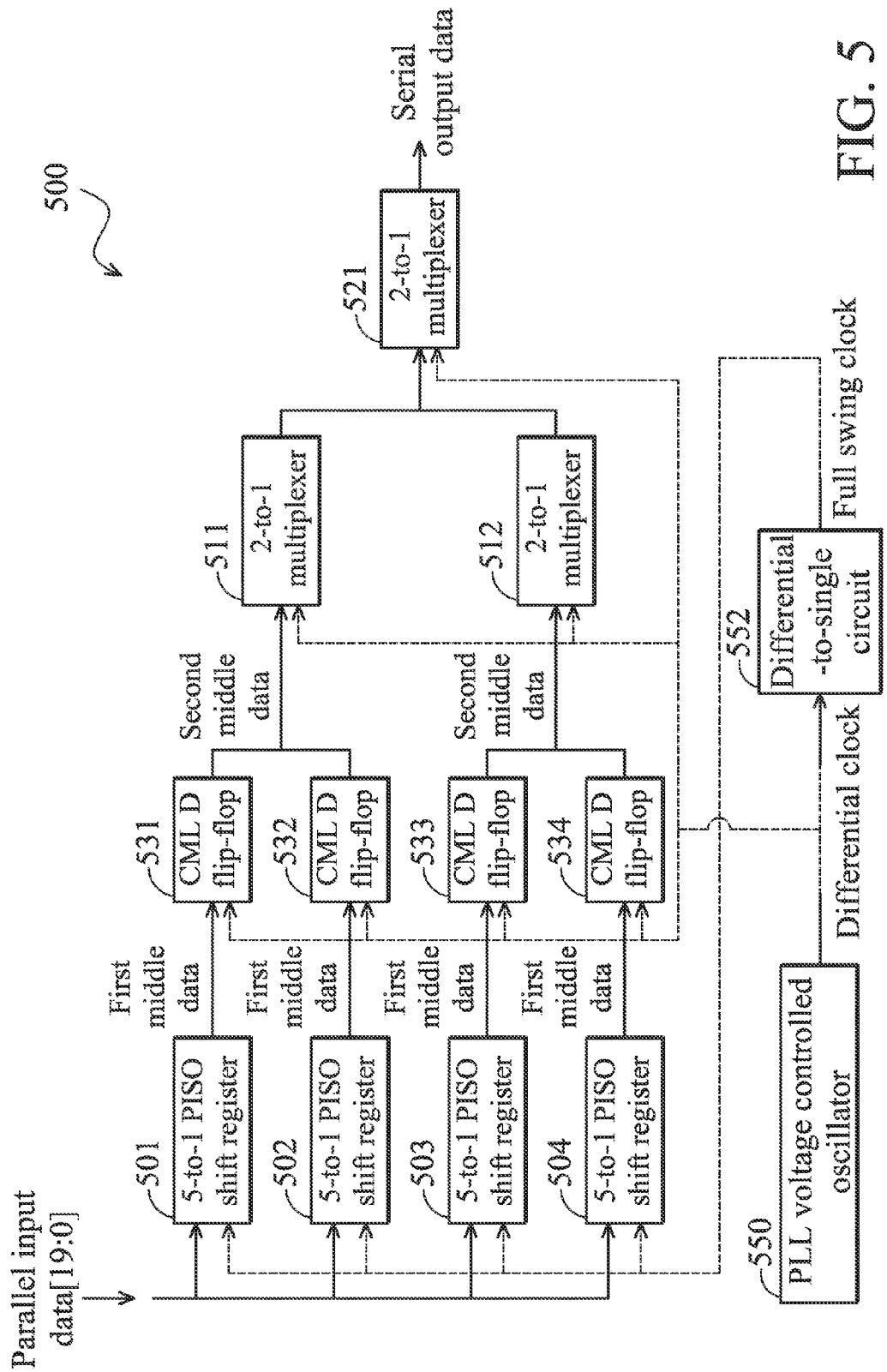
FIG. 5 is a block diagram of a serializer preventing serial output data from being induced by data errors and jitter according to the invention.

To avoid the occurrence of jitter of the serial output data of FIG. 4A and to avoid the occurrence of data errors of FIG. 3B, a serializer is provided. Referring to FIG. 5, a block diagram of a serializer 500 preventing serial output data from being induced by data errors and jitter according to the invention is shown. In one embodiment, the serializer 500 comprises a plurality of PISO shift registers 501~504, a plurality of multiplexers 511, 512, and 521, a PLL voltage controlled oscillator 550, a differential-to-single circuit 552, and a plurality of current mode logic (CML) D flip-flops 531, 532, 533, and 534. The PISO shift registers 501~504 have the same functions as those of the PISO shift registers 101~104 shown in FIG. 1. The CML D flip-flops 531~534 respectively sample and buffer the first middle data signals generated by the PISO shift registers 501~504 according to the differential clock to generate a plurality of second middle data signals as inputs of the multiplexers 511 and 512. The multiplexers 511, 512, and 521 also have the same functions as those of the multiplexers 111, 112, and 121 shown in FIG. 1. The PLL voltage controlled oscillator 550 generates a noiseless differential clock to trigger the operations of the CML D flip-flops 531~534 and the multiplexers 511, 512, and 521. The differential-to-single circuit 552 then generates a full swing clock according to the differential clock to trigger the operations of the PISO shift registers 501~504. In one embodiment, the PISO shift registers are 5-to-1 PISO shift registers. In one embodiment, the multiplexers 511, 512, and 521 are 2-to-1 multiplexers.

First, the PISO shift registers 501~504 respectively select 5 received input bits from the 20 input bits of the parallel input data, and then respectively serialize the 5 received input bits according to the full swing clock generated by the differential-to-single circuit 552 to generate the first middle data signals. The CML D flip-flops 531~534 then respectively latches the first middle data signals according to the noiseless differential clock generated by the PLL voltage controlled oscillator 550 to generate the second middle data signals. The multiplexer 511 then interleaves the second middle data signals generated by the CML D flip-flops 531 and 532 according to the noiseless differential clock to generate a third middle data signal. The multiplexer 512 also interleaves the second middle data signals generated by the CML D flip-flops 533 and 534 according to the noiseless differential clock to generate a third middle data signal. The multiplexer 521 then interleaves the third middle data signals generated by the multiplexers 511 and 512 according to the noiseless differential clock to generate the serial data output.

Although there is a phase difference between the full swing clock generated by the differential-to-single circuit 552 and the differential clock due to S corner variation or F corner variation, because the CML D flip-flops 531 and 532 sample the first middle data signals according to the noiseless differential clock, the second middle data signals generated by the CML D flip-flops 531 and 532 has a phase corresponding to that of the differential clock. Thus, when the multiplexers 511 and 512 sample the second middle data signals according to the differential clock, data errors are not induced. In addition, because the CML D flip-flops 531~534 and the multiplexers 511, 512, and 521 are triggered by the noiseless differential clock, jitter is therefore not induced to the serial data output. Because the serializer 500 successfully prevents the serial output data from errors and jitter, the performance of the serializer 500 shown in FIG. 5 is better than those of the serializers 300 and 400 shown in FIGS. 3 and 4.

Figure 6:
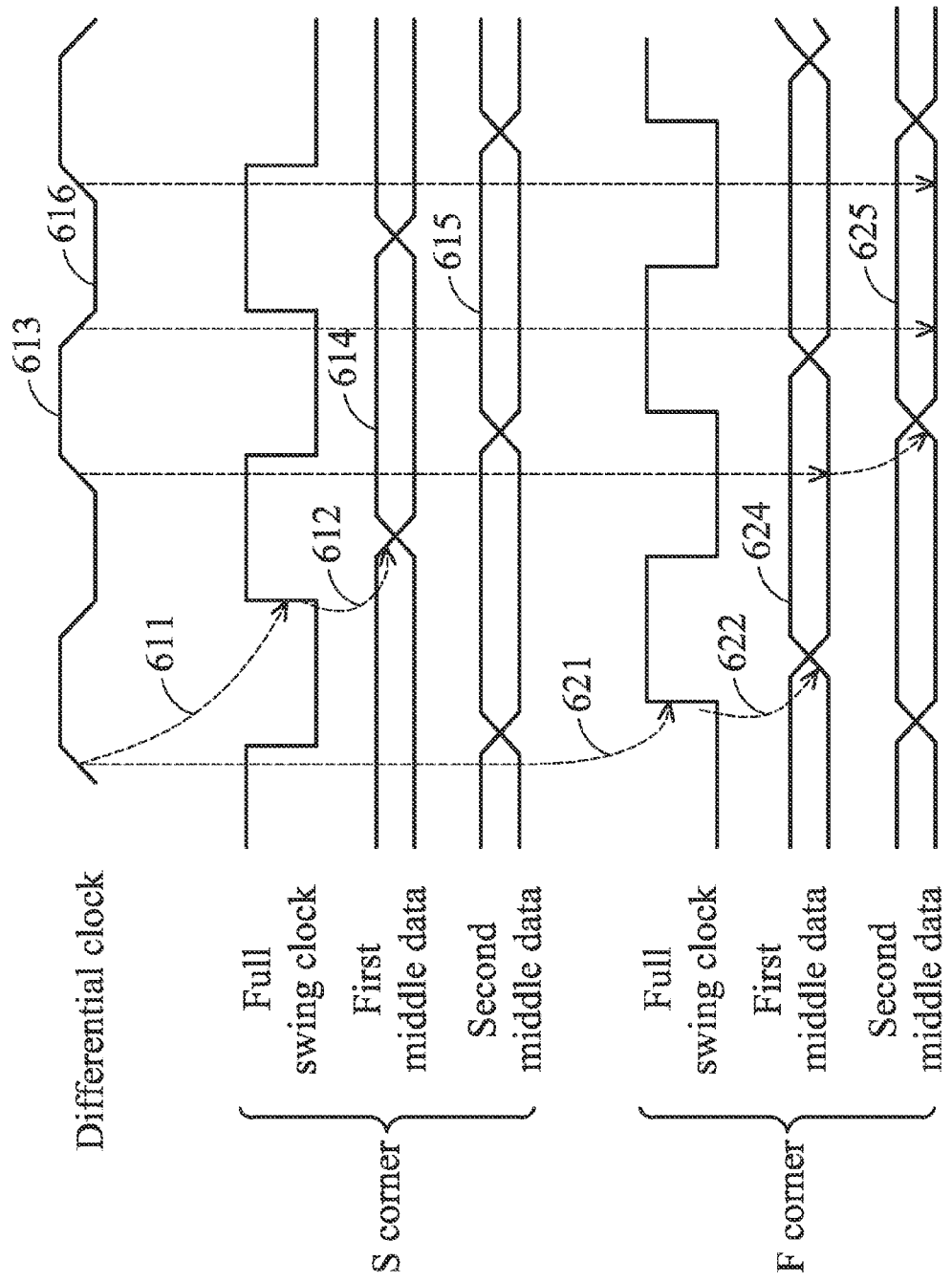
FIG. 6 is a data sampling process of the serializer shown in FIG. 5.

Referring to FIG. 6, a data sampling process of the serializer 500 shown in FIG. 5 is shown. The PLL voltage controlled oscillator 550 generates a noiseless differential clock. The differential-to-single circuit 552 then derives a full swing clock from the differential clock, and there is an F corner variation 621 or S corner variation 611 between the full swing clock and the differential clock. When there is an S corner variation 611 between the full swing clock and the differential clock, the PISO shift registers 501~504 generate first middle data signals 614 according to the full swing clock, and there is a short delay 612 between the first middle data signals 614 and the full swing clock. In addition, the CML D flip-flops 531~534 latch the first middle data signals 614 according to the noiseless differential clock to generate second middle data signals 615. When the multiplexers 511 and 512 sample the second middle data signals 615 according to the differential clock 616, because the period 616 in which the differential clock has a false value corresponds to the data period 615 of the second middle data signals, data errors are not induced.

Similarly, when there is an F corner variation 621 between the full swing clock and the differential clock, the PISO shift registers 501~504 generate first middle data signals 624 according to the full swing clock, and there is a short delay 622 between the first middle data signals 624 and the full swing clock. In addition, the CML D flip-flops 531~534 latch the first middle data signals 624 according to the noiseless differential clock to generate second middle data signals 625. When the multiplexers 511 and 512 sample the second middle data signals 625 according to the differential clock 616, because the period 616 in which the differential clock has a false value corresponds to the data period 625 of the second middle data signals, data errors are not induced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A serializer, converting parallel input data into serial output data according to a full swing clock and a noiseless differential clock, comprising:
    a plurality of parallel-input-serial-output (PISO) shift registers, respectively selecting a plurality of received input bits from the input bits of the parallel input data, and respectively serializing the received input bits according to the full swing clock to generate a plurality of first middle data signals;
    a plurality of current-mode-logic (CML) D flip-flops, respectively latching the first middle data signals to generate a plurality of second middle data signals; and
    at least one multiplexer, receiving the second middle data signals, interleaving the second middle data signals according to the noiseless differential clock to generate the serial output data.

2. The serializer as claimed in claim 1, wherein the serializer further comprises:
    a clock generation circuit, generating the noiseless differential clock, and deriving the full swing clock from the noiseless differential clock.

3. The serializer as claimed in claim 2, wherein the clock generation circuit comprises:
    a phase-locked-loop (PLL) voltage controlled oscillator (VCO), generating the noiseless differential clock; and
    a differential-to-single circuit, deriving the full swing clock from the noiseless differential clock.

4. The serializer as claimed in claim 1, wherein the at least one multiplexer comprises:
    a plurality of first multiplexers, respectively selecting a plurality of selected data signals from the second middle data signals, and respectively mixing the bits of the selected data signals according to the noiseless differential clock to generate a plurality of third middle data signals; and
    a second multiplexer, mixing the bits of the third middle data signal according to the noiseless differential clock to generate the serial output data.

5. The serializer as claimed in claim 4, wherein the first multiplexers are 2-to-1 multiplexers, and the second multiplexer is a 2-to-1 multiplexer.

6. The serializer as claimed in claim 1, wherein the PISO shift registers are 5-to-1 PISO shift registers.

7. A data serializing method, for converting parallel input data into serial output data, wherein a serializer comprises a plurality of parallel-input-serial-output (PISO) shift registers, a plurality of current-mode-logic (CML) D flip-flops, and at least one multiplexer, the data serializing method comprising:
    respectively selecting a plurality of received input bits from the input bits of the parallel input data by the PISO shift registers;
    respectively serializing the received input bits according to the full swing clock to generate a plurality of first middle data signals by the PISO shift registers;
    respectively latching the first middle data signals by the CML D flip-flops to generate a plurality of second middle data signals; and
    interleaving the second middle data signals according to the noiseless differential clock by the at least one multiplexer to generate the serial output data.

8. The data serializing method as claimed in claim 7, wherein the serializer further comprises a clock generation circuit, and the data serializing method further comprises:
    generating the noiseless differential clock by the clock generation circuit; and
    deriving the full swing clock from the noiseless differential clock by the clock generation circuit.

9. The data serializing method as claimed in claim 8, wherein the clock generation circuit comprises:
    a phase-locked-loop (PLL) voltage controlled oscillator (VCO), generating the noiseless differential clock; and
    a differential-to-single circuit, deriving the full swing clock from the noiseless differential clock.

10. The data serialzing method as claimed in claim 7, wherein the at least one multiplexer comprises a plurality of first multiplexers and a second multiplexer, and generation of the serial output data comprises:
    respectively selecting a plurality of selected data signals from the second middle data signals by the first multiplexers;
    respectively mixing the bits of the selected data signals according to the noiseless differential clock by the first multiplexers to generate a plurality of third middle data signals; and
    mixing the bits of the third middle data signal according to the noiseless differential clock by the second multiplexer to generate the serial output data.

11. The data serializing method as claimed in claim 10, wherein the first multiplexers are 2-to-1 multiplexers, and the second multiplexer is a 2-to-1 multiplexer.

12. The data serializing method as claimed in claim 7, wherein the PISO shift registers are 5-to-1 PISO shift registers.

* * * * *